(12) United States Patent
Li

(10) Patent No.: US 10,043,477 B2
(45) Date of Patent: Aug. 7, 2018

(54) GOA CIRCUIT

(71) Applicant: Wuhan China Star Optoelectronics Technology Co., Ltd., Wuhan (CN)

(72) Inventor: Yafeng Li, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 138 days.

(21) Appl. No.: 15/128,106

(22) PCT Filed: Aug. 31, 2016

(86) PCT No.: PCT/CN2016/097457
§ 371 (c)(1),
(2) Date: Sep. 21, 2016

(87) PCT Pub. No.: WO2018/028009
PCT Pub. Date: Feb. 15, 2018

(65) Prior Publication Data
US 2018/0174545 A1 Jun. 21, 2018

(30) Foreign Application Priority Data
Aug. 8, 2016 (CN) .......................... 2016 1 0642892

(51) Int. Cl.
*G09G 3/36* (2006.01)

(52) U.S. Cl.
CPC ......... *G09G 3/3696* (2013.01); *G09G 3/3648* (2013.01); *G09G 3/3677* (2013.01); *G09G 3/3688* (2013.01); *G09G 2310/08* (2013.01); *G09G 2330/021* (2013.01)

(58) Field of Classification Search
CPC ............. G09G 3/3696; G09G 2310/08; G09G 2330/021; G09G 3/3688; G09G 3/3677; G09G 3/3648
See application file for complete search history.

(56) References Cited

U.S. PATENT DOCUMENTS

| | | | | |
|---|---|---|---|---|
| 9,779,684 | B2* | 10/2017 | Li | G09G 3/3677 |
| 9,842,566 | B2* | 12/2017 | Lee | G09G 5/006 |
| 2015/0365085 | A1* | 12/2015 | Qing | H03K 17/302 |
| | | | | 345/100 |
| 2016/0055814 | A1* | 2/2016 | Yang | G09G 3/3677 |
| | | | | 345/213 |

(Continued)

*Primary Examiner* — Dmitriy Bolotin
(74) *Attorney, Agent, or Firm* — Leong C. Lei

(57) ABSTRACT

The invention provides a GOA circuit, using the ninth and tenth TFTs and the resistor to control the voltage level of the third node, wherein ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor. Through the m-th and the (m+2)-th clock signal to control the ninth and the tenth TFTs to become conductive alternately, the present invention can charge and discharge the third node regularly to prevent the threshold voltage shift of the key TFT because the third node stays high for extended time, and ensure the stability of GOA circuit.

17 Claims, 8 Drawing Sheets

(56) References Cited

U.S. PATENT DOCUMENTS

| | | | |
|---|---|---|---|
| 2016/0071614 A1* | 3/2016 | Lee | G09G 5/006 |
| | | | 345/214 |
| 2016/0372063 A1* | 12/2016 | Li | G11C 19/28 |
| 2017/0124975 A1* | 5/2017 | Xiao | G06F 3/0412 |
| 2017/0270881 A1* | 9/2017 | Li | G09G 3/3677 |
| 2018/0108316 A1* | 4/2018 | Li | G09G 3/3677 |

* cited by examiner

GOA CIRCUIT

BACKGROUND OF THE INVENTION

1. Field of the Invention

The present invention relates to the field of display, and in particular to a gate driver on array (GOA) circuit.

2. The Related Arts

As the liquid crystal display (LCD) shows the advantages of being thin, low power-consumption, and no radiation, the LCD is widely used in various devices, such as, liquid crystal TV, mobile phones, PDA, digital camera, PC monitors or notebook PC screens as well as the leading technology in tablet PCs.

The gate driver on array (GOA) technology is the array substrate column drive technology, by using the array substrate process for the LCD panel to manufacture the driver circuit for the horizontal scan line in the area around the active area on the substrate to replace the external integrated circuit (IC) to perform driving the horizontal scan lines. GOA technology can reduce the bonding process for the external IC and reduce cost, as well as the ability to realize narrow-border or borderless panels, and is used by many types of displays.

Refer to FIG. 1. A known GOA circuit comprises: a plurality of cascade GOA units, with each GOA unit comprising: a scan control module 100, an output module 200 and a node control module 300; for a positive integer n and a positive number m, in the n-th stage GOA unit, the scan control module 100 comprising: a first thin film transistor (TFT) T1, with the gate connected to the gate scan signal G(n−2) of the (n−2)-th stage GOA unit, the source connected to forward scan control signal U2D, and the drain connected to a first node H(n); and a third TFT, with the gate connected to the gate scan signal G(n+2) of the (n+2)-th stage GOA unit, the source connected to backward scan control signal D2U, and the drain connected to a first node H(n); The output module 200 comprising: a second TFT T2 and a first capacitor C1, the second TFT T2 having the gate connected to the second node Q(n), the source connected to the (m+1)-th clock signal CK(m+1), and the drain connected to the gate scan signal G(n) of the n-th stage GOA unit, and the first capacitor C1 having one end connected to the second node Q(n), and the other end connected to the gate scan signal G(n) of the n-th stage GOA unit; the node control module 300 comprising: a fourth TFT T4, a fifth TFT T5, a sixth TFT T6, a seventh TFT T7, an eighth TFT T8, a ninth TFT T9, and a second capacitor C2, the fourth TFT T4 having the gate connected to a third node P(n), the source connected to the gate scan signal G(n) of the n-th stage GOA unit, and the drain connected to a constant low voltage VGL; the fifth TFT T5 having the gate connected to a constant high voltage VGH, the source connected to the first node H(n), and the drain connected to the second node Q(n); the sixth TFT T6 having the gate connected to the first node H(n), the source connected to the third node P(n), and the drain connected to the constant low voltage VGL; the seventh TFT T7 having the gate connected to the third node P(n), the source connected to the second node Q(n), and the drain connected to the constant low voltage VGL; the eighth TFT T8 having the gate connected to the (m+3)-th clock signal CK(m+3), the source connected to the gate scan signal G(n) of the n-th stage GOA unit, and the drain connected to the constant low voltage VGL; the ninth TFT T9 having both the gate and the source connected to the (m+2)-th clock signal CK(m+2), and the drain connected to the third node P(n); and the second capacitor C2 having one end connected to the third node P(n) and the other end connected to the constant low voltage VGL.

In the known GOA circuit, during a non-outputting phase, the third node P(n) will stay at high level for an extended period of time, and the fourth TFT T4 and the seventh TFT T7 stay conductive for an extended period of time so that the fourth TFT T4 and the seventh TFT T7 may experience threshold voltage shift (Vth shift), which leads to reduced stability and abnormal output in the GOA circuit.

SUMMARY OF THE INVENTION

The object of the present invention is to provide a GOA circuit, able to charge and discharge the third node regularly to prevent the threshold voltage shift of the key thin film transistor (TFT) because the third node stays high for extended time, and ensure the stability of GOA circuit.

To achieve the above object, the present invention provides a GOA circuit, which comprises: a plurality of cascade GOA units, each GOA unit comprising: a scan control module, an output module connected to the scan control module, a pull-down module connected to the output module, and a pull-down control module connected to the scan control module, the output module and the pull-down module; for a positive integer n and a positive number m, other than the GOA unit in the first, the second, and the last two stages, in the n-th GOA unit, the scan control module using a forward scan control signal and a backward scan control signal to control the GOA circuit to perform forward scanning or backward scanning; the output module being connected to an (m+1)-th clock signal for using the (m+1)-th clock signal to output an n-th gate scan signal during an operation duration of the n-th GOA unit; the pull-down module pulling down the voltage level of the n-th gate scan signal during a non-operation duration of the n-th GOA unit; and the pull-down control module being connected to an m-th clock signal, an (m+2)-th clock signal, a first constant voltage, and a second constant voltage, for shutting down the pull-down module and maintaining the output module turned on during the operation duration of the n-th GOA unit, and turning on the pull-down module and shutting down the output module during the non-operation duration of the n-th GOA unit, as well as using the m-th clock signal and the (m+2)-th clock signal to control the first constant voltage and the second constant voltage to regularly charge and discharge a switch node of the pull-down module; the first constant voltage and the second constant voltage having opposite voltage levels, and the forward scan control signal and the backward scan control signal having opposite voltage levels.

The scan control module comprises: a first thin film transistor (TFT) and a third TFT; the output module comprises: a second TFT and a first capacitor; the pull-down module comprises: a fourth TFT, a eighth TFT, and a second capacitor; and the pull-down control module comprises: a sixth TFT, a seventh TFT, a ninth TFT, a tenth TFT and a resistor; the GOA circuit further comprises a regulator module, which comprising: a fifth TFT; the first TFT having the gate connected to the gate scan signal of the (n−2)-th GOA unit, the source connected to the forward scan control signal, and the drain connected to a first node; the second TFT having the gate connected to a second node, the source connected to the (m+1)-th clock signal, and the drain connected to the gate scan signal of the n-th GOA unit; the third TFT having the gate connected to the gate scan signal of the (n+2)-th GOA unit, the source connected to the backward scan control signal, and the drain connected to the first node; the fourth TFT having the gate connected to a third node, the source connected to the gate scan signal of the n-th GOA unit, and the drain connected to the second constant voltage; the fifth TFT having the gate connected to the first constant voltage, the source connected to the first node, and the drain connected to the second node; the sixth TFT having the gate connected to the first node, the source connected to the third node, and the drain connected to the second constant voltage; the seventh TFT having the gate connected to the third node, the source connected to the second node, and the drain connected to the second constant voltage; the eighth TFT having the gate connected to an (m+3)-th clock signal, the source connected to the gate scan signal of the n-th GOA unit, and the drain connected to the second constant voltage; the ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor; the second capacitor having one end connected to the third node and the other end connected to the second constant voltage; the first capacitor having one end connected to the second node and the other end connected to the gate scan signal of the n-th GOA unit; and the third node is the switch node of the pull-down module.

In the first and the second GOA units, the gates of the first TFTs are connected to a circuit activation signal.

In the last two GOA units, the gates of the third TFTs are connected to a circuit activation signal.

The clock signals comprise four clock signals: a first clock signal, a second clock signal, a third clock signal and a fourth clock signal, when the m-th clock signal is the second clock signal, the (m+3)-th clock signal is the first clock signal; when the m-th clock signal is the third clock signal, the (m+2)-th clock signal is the first clock signal and the (m+3)-th clock signal is the second clock signal; when the m-th clock signal is the fourth clock signal, the (m+1)-th clock signal is the first clock signal, the (m+2)-th clock signal is the second clock signal and the (m+3)-th clock signal is the third clock signal.

The first, second, third and fourth clock signals have the same pulse cycle, and the falling edge of a previous clock signal is generated simultaneously with the rising edge of a next clock signal.

All the TFTs are of the N-type TFTs, the first constant voltage is a constant high voltage, and the second constant voltage is a constant low voltage.

All the TFTs are of the P-type TFTs, the first constant voltage is a constant low voltage, and the second constant voltage is a constant high voltage.

All the TFTs are of the low temperature polysilicon (LTPS) TFTs.

During forward scanning, the forward scan control signal is at high level, and the backward scan control signal is at low level; during backward scanning, the forward scan control signal is at low level, and the backward scan control signal is at high level.

During forward scanning, the forward scan control signal is at low level, and the backward scan control signal is at high level; during backward scanning, the forward scan control signal is at high level, and the backward scan control signal is at low level.

The present invention also provides a GOA circuit, which comprises: a plurality of cascade GOA units, each GOA unit comprising: a scan control module, an output module connected to the scan control module, a pull-down module connected to the output module, and a pull-down control module connected to the scan control module, the output module and the pull-down module; for a positive integer n and a positive number m, other than the GOA unit in the first, the second, and the last two stages, in the n-th GOA unit, the scan control module using a forward scan control signal and a backward scan control signal to control the GOA circuit to perform forward scanning or backward scanning; the output module being connected to an (m+1)-th clock signal for using the (m+1)-th clock signal to output an n-th gate scan signal during an operation duration of the n-th GOA unit; the pull-down module pulling down the voltage level of the n-th gate scan signal during a non-operation duration of the n-th GOA unit; and the pull-down control module being connected to an m-th clock signal, an (m+2)-th clock signal, a first constant voltage, and a second constant voltage, for shutting down the pull-down module and maintaining the output module turned on during the operation duration of the n-th GOA unit, and turning on the pull-down module and shutting down the output module during the non-operation duration of the n-th GOA unit, as well as using the m-th clock signal and the (m+2)-th clock signal to control the first constant voltage and the second constant voltage to regularly charge and discharge a switch node of the pull-down module; the first constant voltage and the second constant voltage having opposite voltage levels, and the forward scan control signal and the backward scan control signal having opposite voltage levels; the scan control module comprising: a first thin film transistor (TFT) and a third TFT; the output module comprising: a second TFT and a first capacitor; the pull-down module comprising: a fourth TFT, a eighth TFT, and a second capacitor; and the pull-down control module comprising: a sixth TFT, a seventh TFT, a ninth TFT, a tenth TFT and a resistor; the GOA circuit further comprising a regulator module, which comprising: a fifth TFT; the first TFT having the gate connected to the gate scan signal of the (n−2)-th GOA unit, the source connected to the forward scan control signal, and the drain connected to a first node; the second TFT having the gate connected to a second node, the source connected to the (m+1)-th clock signal, and the drain connected to the gate scan signal of the n-th GOA unit; the third TFT having the gate connected to the gate scan signal of the (n+2)-th GOA unit, the source connected to the backward scan control signal, and the drain connected to the first node; the fourth TFT having the gate connected to a third node, the source connected to the gate scan signal of the n-th GOA unit, and the drain connected to the second constant voltage; the fifth TFT having the gate connected to the first constant voltage, the source connected to the first node, and the drain connected to the second node; the sixth TFT having the gate connected to the first node, the source connected to the third node, and the drain connected to the second constant voltage; the seventh TFT having the gate connected to the third node, the source connected to the second node, and the drain connected to the second constant voltage; the eighth TFT having the gate connected to an (m+3)-th clock signal, the source connected to the gate scan signal of the n-th GOA unit, and the drain connected to the second constant voltage; the ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor; the second capacitor having one end connected to the third node and the other end connected to the second constant voltage; the first capacitor having one end connected to the second node and the other end connected to the gate scan signal of the n-th GOA unit; and the third node is the switch node of the pull-down module; in the first and the second GOA units, the gates of the first TFTs being connected to a circuit activation signal; in the last two GOA units, the gates of the third TFTs being connected to a circuit activation signal; all the TFTs being of the low temperature polysilicon (LTPS) TFTs.

Compared to the known techniques, the present invention provides the following advantages: the present invention provides a GOA circuit, using the ninth and tenth TFTs and the resistor to control the voltage level of the third node, wherein ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor. Through the m-th and the (m+2)-th clock signal to control the ninth and the tenth TFTs to become conductive alternately, the present invention can charge and discharge the third node regularly to prevent the threshold voltage shift of the key TFT because the third node stays high for extended time, and ensure the stability of GOA circuit.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
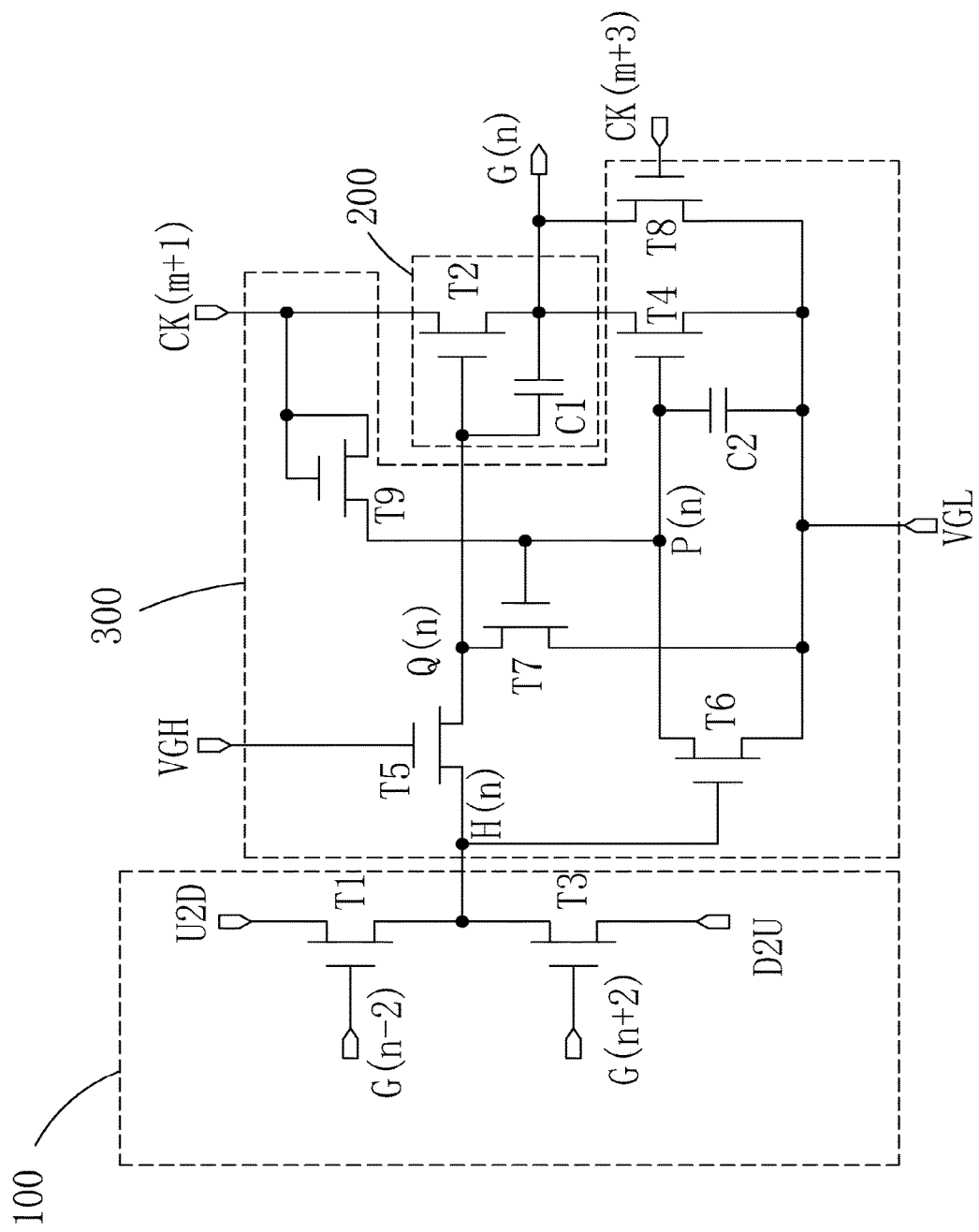
FIG. 1 is a schematic view showing a known GOA circuit.
Figure 2:
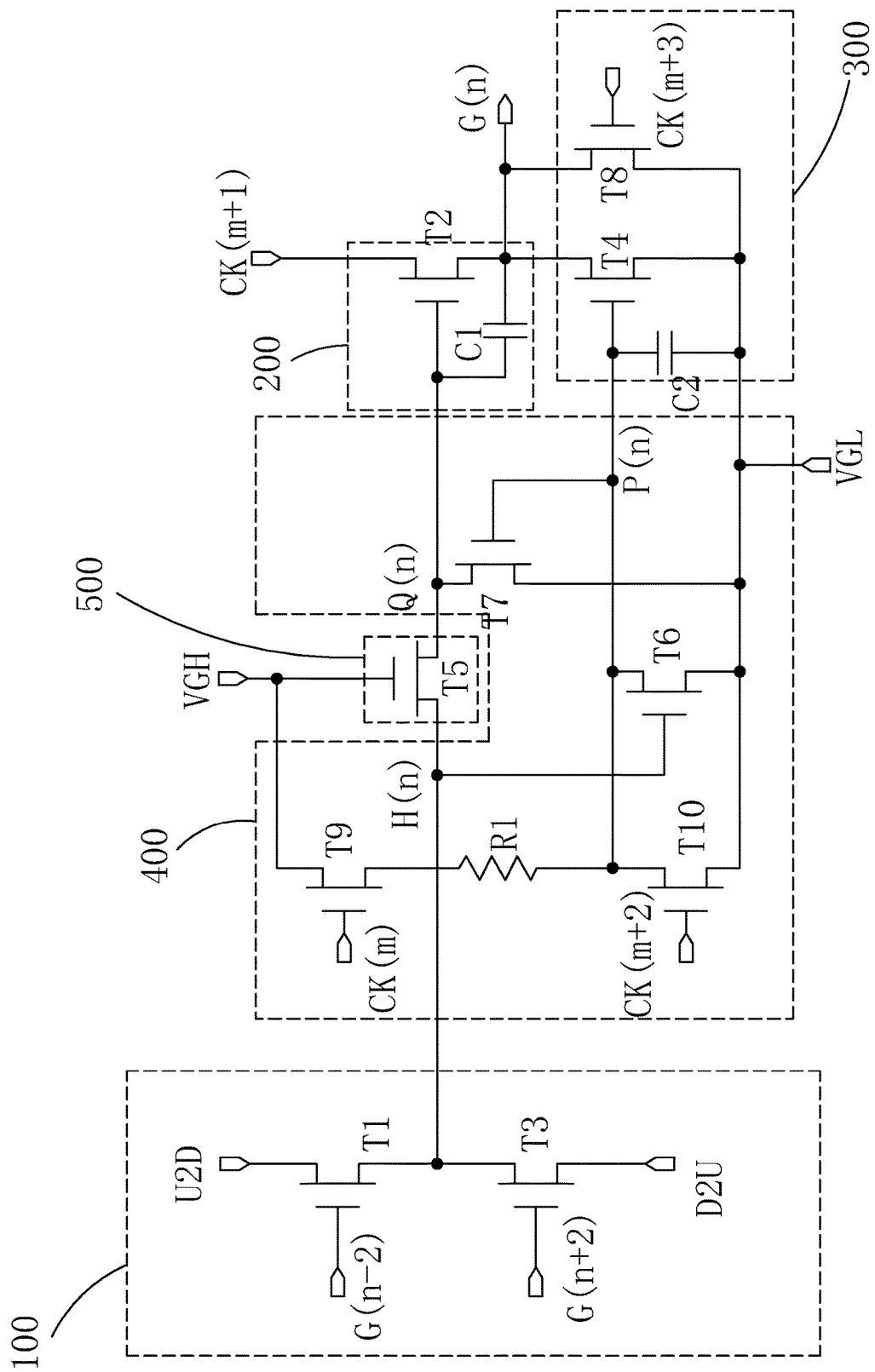
FIG. 2 is a schematic view showing the GOA circuit provided by an embodiment of the present invention.

Refer to FIG. 2. The present invention provides a GOA circuit, which comprises: a plurality of cascade GOA units, each GOA unit comprising: a scan control module 100, an output module 200 connected to the scan control module 100, a pull-down module 300 connected to the output module 200, and a pull-down control module 400 connected to the scan control module 100, the output module 200 and the pull-down module 300.

For a positive integer n and a positive number m, other than the GOA unit in the first, the second, and the last two stages, in the n-th GOA unit, the scan control module 100 is for using a forward scan control signal U2D and a backward scan control signal D2U to control the GOA circuit to perform forward scanning or backward scanning.

The output module 200 is connected to an (m+1)-th clock signal CK(m+1) for using the (m+1)-th clock signal to output an n-th gate scan signal G(n) during an operation duration of the n-th GOA unit.

The pull-down module 300 is for pulling down the voltage level of the n-th gate scan signal G(n) during a non-operation duration of the n-th GOA unit.

The pull-down control module 400 is connected to an m-th clock signal CK(m), an (m+2)-th clock signal CK(m+2), a first constant voltage, and a second constant voltage, for shutting down the pull-down module 300 and maintaining the output module 200 turned on during the operation duration of the n-th GOA unit, and turning on the pull-down module 300 and shutting down the output module 200 during the non-operation duration of the n-th GOA unit, as well as using the m-th clock signal CK(m) and the (m+2)-th clock signal CK(m+2) to control the first constant voltage and the second constant voltage to regularly charge and discharge a switch node of the pull-down module 400.

The first constant voltage and the second constant voltage have the opposite voltage levels, and the forward scan control signal U2D and the backward scan control signal D2U have the opposite voltage levels.

Specifically, the scan control module 200 comprises: a first thin film transistor (TFT) T1 and a third TFT T3; the output module 200 comprises: a second TFT T2 and a first capacitor C1; the pull-down module 300 comprises: a fourth TFT T4, a eighth TFT T8, and a second capacitor C2; and the pull-down control module 400 comprises: a sixth TFT T6, a seventh TFT T7, a ninth TFT T9, a tenth TFT T10 and a resistor R1.

The GOA circuit further comprises a regulator module 500, which comprising: a fifth TFT T5.

Furthermore, the first TFT T1 has the gate connected to the gate scan signal G(n−2) of the (n−2)-th GOA unit, the source connected to the forward scan control signal U2D, and the drain connected to a first node H(n); the second TFT T2 has the gate connected to a second node Q(n), the source connected to the (m+1)-th clock signal CK(m+1), and the drain connected to the gate scan signal G(n) of the n-th GOA unit; the third TFT T3 has the gate connected to the gate scan signal G(n+2) of the (n+2)-th GOA unit, the source connected to the backward scan control signal D2U, and the drain connected to the first node H(n); the fourth TFT T4 has the gate connected to a third node P(n), the source connected to the gate scan signal G(n) of the n-th GOA unit, and the drain connected to the second constant voltage; the fifth TFT T5 has the gate connected to the first constant voltage, the source connected to the first node H(n), and the drain connected to the second node Q(n); the sixth TFT T6 has the gate connected to the first node H(n), the source connected to the third node P(n), and the drain connected to the second constant voltage; the seventh TFT T7 has the gate connected to the third node P(n), the source connected to the second node Q(n), and the drain connected to the second constant voltage; the eighth TFT T8 has the gate connected to an (m+3)-th clock signal CK(m+3), the source connected to the gate scan signal G(n) of the n-th GOA unit, and the drain connected to the second constant voltage; the ninth TFT T9 has the gate connected to the m-th clock signal CK(m), the source connected to the first constant voltage, and the drain connected to one end of the resistor R1; the tenth TFT T10 has the gate connected to the (m+2)-th clock signal CK(m+2), the source connected to the second constant voltage, and the drain connected to the other end of the resistor R1; the first capacitor C1 has one end connected to the second node Q(n) and the other end connected to the gate scan signal G(n) of the n-th GOA unit; the second capacitor C2 has one end connected to the third node P(n) and the other end connected to the second constant voltage; wherein the third node P(n) is the switch node of the pull-down module 400.

Figure 3:
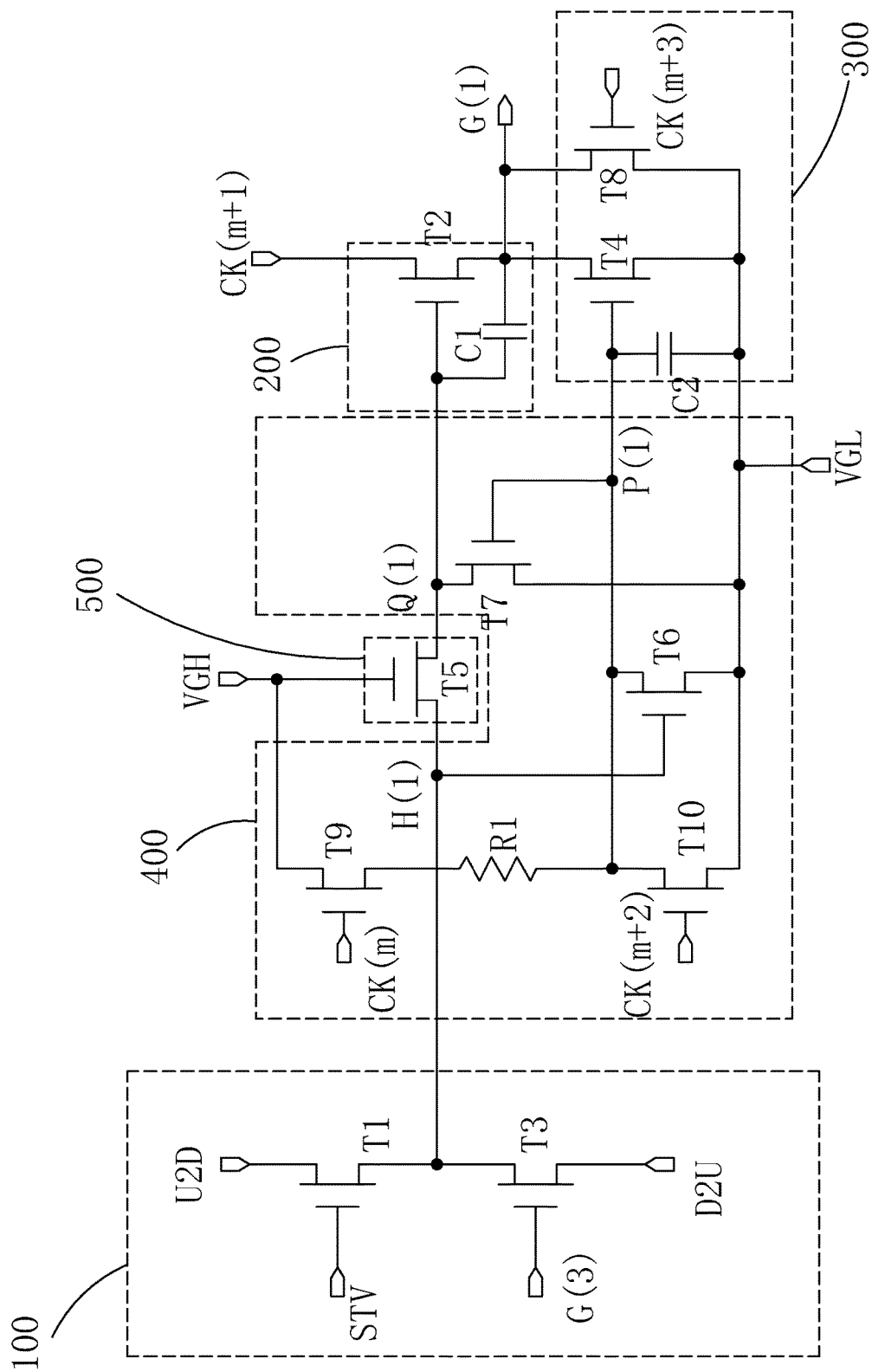
FIG. 3 is a schematic view showing the first-stage GOA unit provided by an embodiment of the present invention.
Figure 4:
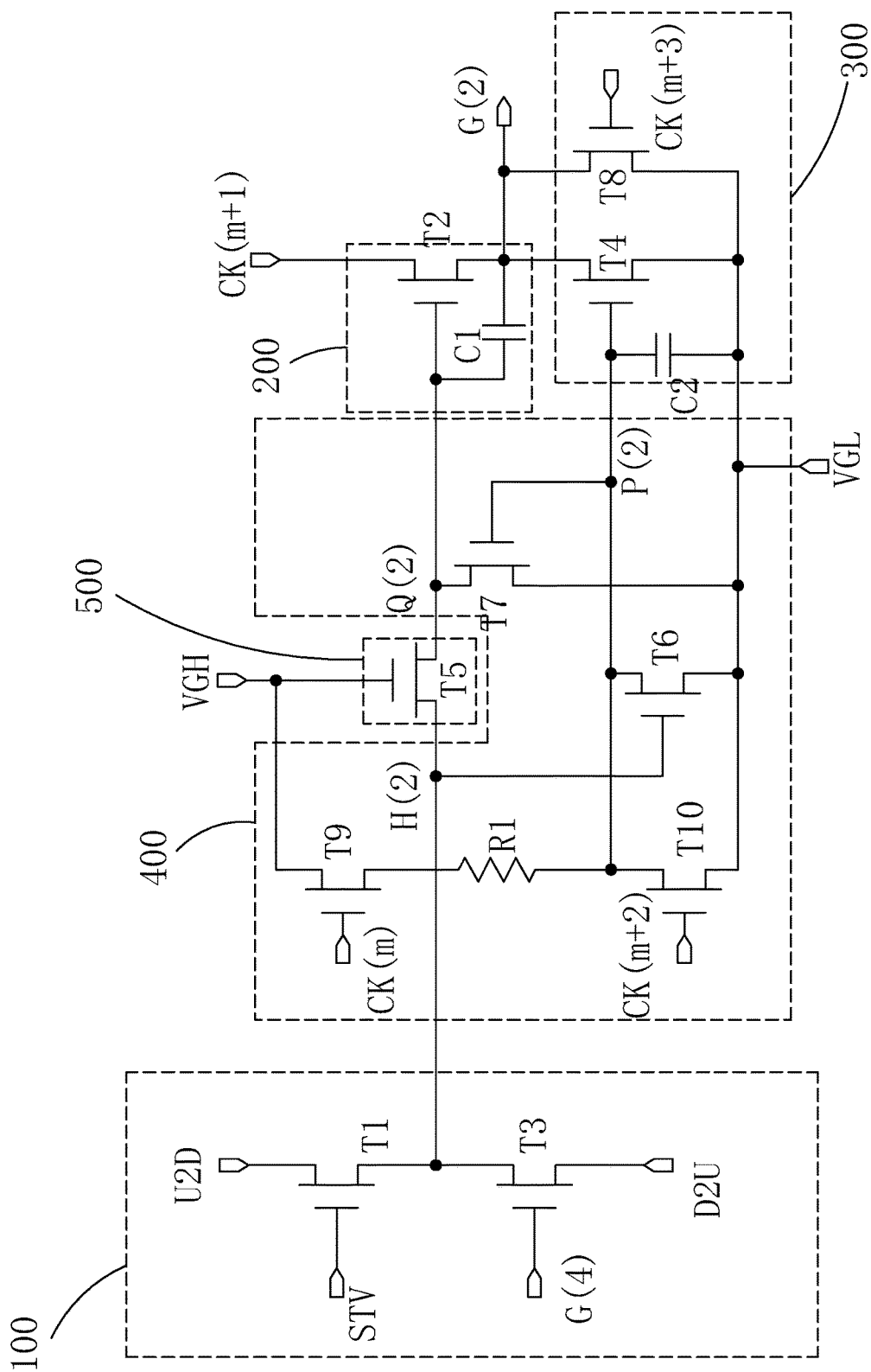
FIG. 4 is a schematic view showing the second-stage GOA unit provided by an embodiment of the present invention.
Figure 5:
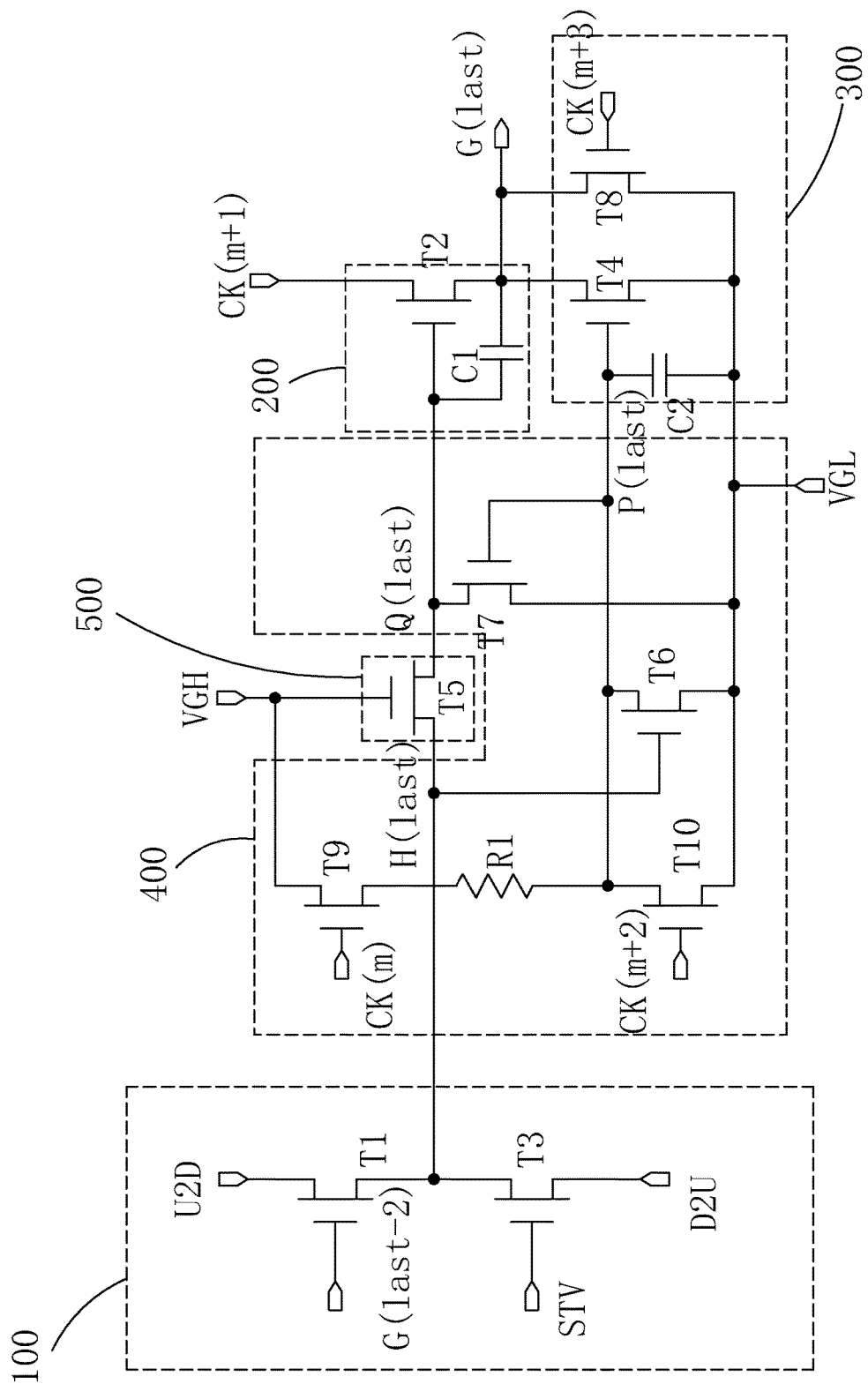
FIG. 5 is a schematic view showing the last-stage GOA unit provided by an embodiment of the present invention.
Figure 6:
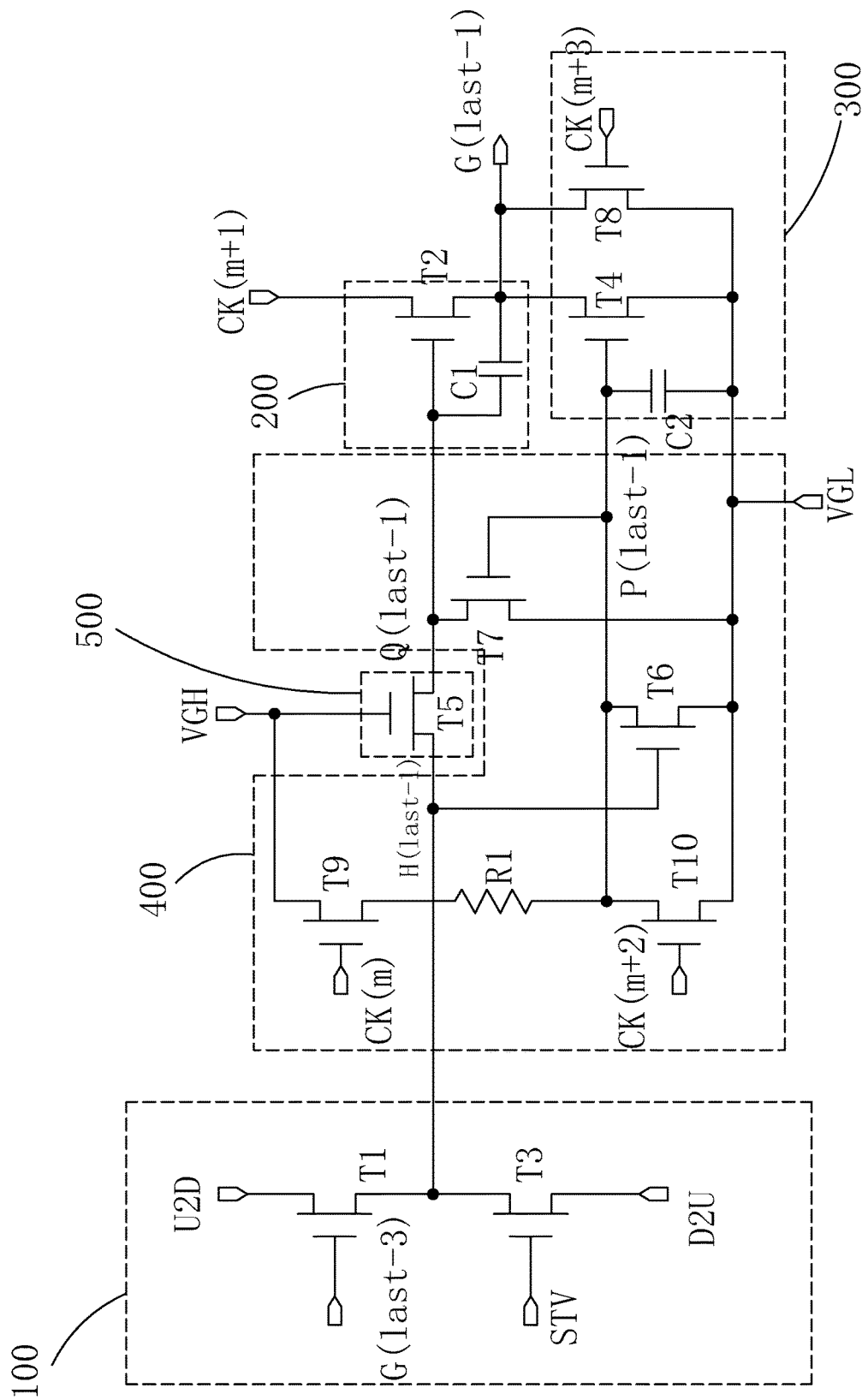
FIG. 6 is a schematic view showing the last-second-stage GOA unit provided by an embodiment of the present invention.

Specifically, refer to FIG. 3 and FIG. 4. In the first and the second GOA units, the gates of the first TFTs T1 are connected to a circuit activation signal STV. Refer to FIG. 5 and FIG. 6. In the last and the second last GOA units, the gates of the third TFTs T3 are connected to a circuit activation signal STV.

It should be noted that the GOA circuit comprises four clock signals: a first clock signal CK(1), a second clock signal CK(2), a third clock signal CK(3) and a fourth clock signal CK(4), when the m-th clock signal is the second clock signal CK(2), the (m+3)-th clock signal is the first clock signal CK(1); when the m-th clock signal is the third clock signal CK(3), the (m+2)-th clock signal is the first clock signal CK(1) and the (m+3)-th clock signal is the second clock signal CK(2); when the m-th clock signal is the fourth clock signal CK(4), the (m+1)-th clock signal is the first clock signal CK(1), the (m+2)-th clock signal is the second clock signal CK(2) and the (m+3)-th clock signal is the third clock signal CK(3).

Furthermore, the first, second, third and fourth clock signals CK(1), CK(2), CK(3), CK(4) have the same pulse cycle, and the falling edge of a previous clock signal is generated simultaneously with the rising edge of a next clock signal. In other words, the first pulse signal of the first clock signal CK(1) is generated first. The moment the first pulse signal of the first clock signal CK(1) ends, the first pulse signal of the second clock signal CK(2) is generated. The moment the first pulse signal of the second clock signal CK(2) ends, the first pulse signal of the third clock signal CK(3) is generated. The moment the first pulse signal of the third clock signal CK(3) ends, the first pulse signal of the fourth clock signal CK(4) is generated. The moment the first pulse signal of the fourth clock signal CK(4) ends, the second pulse signal of the first clock signal CK(1) is generated, and so on.

Optionally, when all the TFTs are of the N-type TFT, the first constant voltage is a constant high voltage VGH, and the second constant voltage is a constant low voltage VGL. During forward scanning, the forward scan control signal U2D is at high level, and the backward scan control signal D2U is at low level; during backward scanning, the forward scan control signal U2D is at low level, and the backward scan control signal D2U is at high level.

Optionally, when all the TFTs are of the P-type TFT, the first constant voltage is a constant low voltage VGL, and the second constant voltage is a constant high voltage VGH. During forward scanning, the forward scan control signal U2D is at low level, and the backward scan control signal D2U is at high level; during backward scanning, the forward scan control signal U2D is at high level, and the backward scan control signal D2U is at low level.

Preferably, all the TFTs are of the low temperature polysilicon (LTPS) TFTs.

Figure 7:
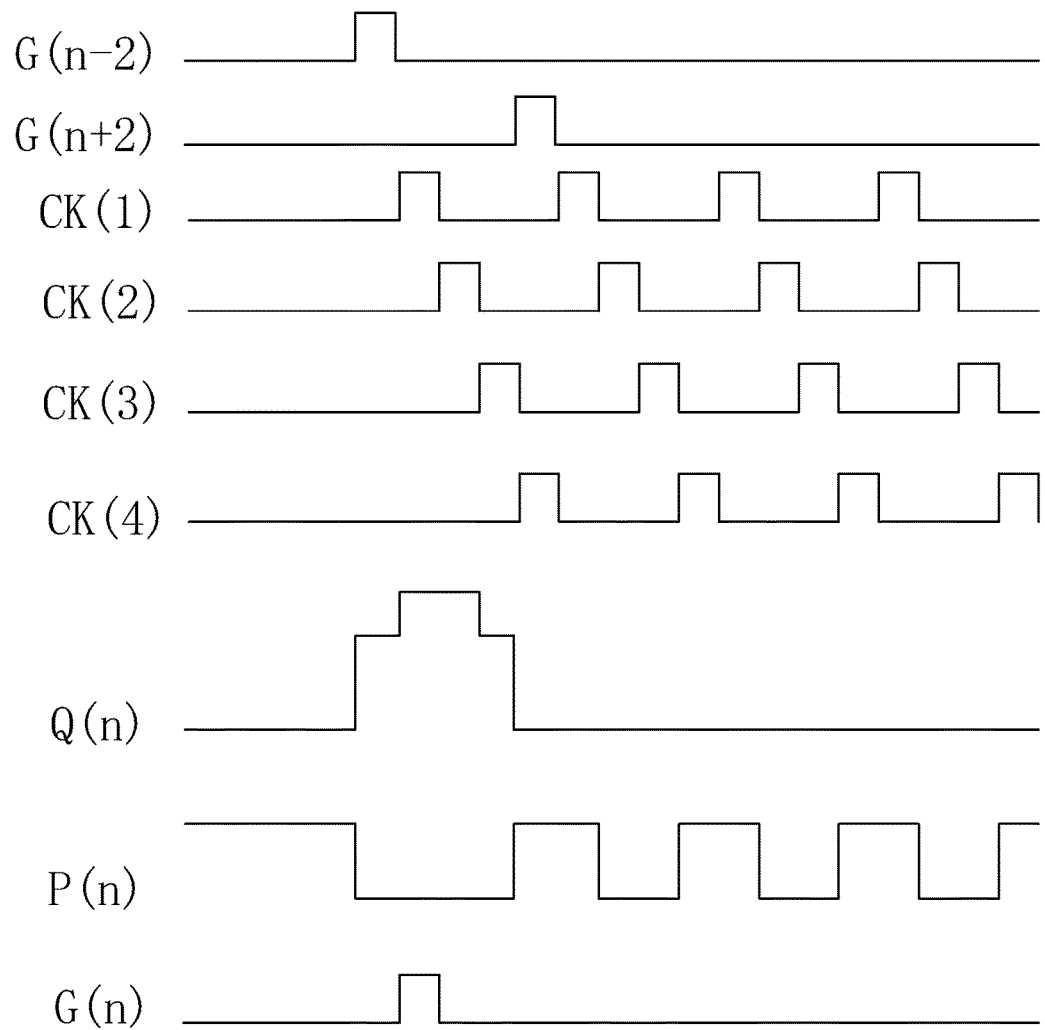
FIG. 7 is a schematic view showing the forward scanning timing for GOA circuit provided by an embodiment of the present invention.

Specifically, refer to FIG. 7. The operation of the GOA circuit (of N-type TFTs) during forward scanning is as follows: first, the gate scan signal G(n-2) of the (n-2)-th GOA unit and the forward scan control signal U2D are high, the first TFT T1 is conductive, the first node H(n) is pre-charged to high level, the seventh TFT T7 is conductive to pull the first node H(n) to high level, the sixth TFT T6 is conductive, the third node P(n) is pulled down to the constant low voltage VGL, at the same time the fifth TFT T5 controlled by the constant high voltage VGH stays conductive, and the second node Q(n) is also pre-charged to high level; then, the gate scan signal G(n-2) of the (n-2)-th GOA unit becomes low, the first TFT T1 is turned off, the second node Q(n) stays high under the holding effect of the first capacitor C1, the second TFT T2 is conductive, the (m+1)-th clock signal CK(m+1) provides a high level, the gate scan signal G(n) outputs a high level; then, the gate scan signal G(n+2) of the (n+2)-th GOA unit provides a high level, the backward scan control signal D2U provides a low level, the third TFT T3 is turned on, the first and second nodes H(n), Q(n) are pulled down to low, the second TFT T2 is turned off, and the sixth TFT T6 is turned off; then, the m-th clock signal CK(m) and the (m+2)-th clock signal CK(m+2) provide a high level alternately to perform charge and discharge on the third node P(n) regularly and maintain the gate scan signal G(n) and the second node Q(n) at low level; wherein, when the m-th clock signal CK(m) is high, the ninth TFT T9 is conductive and the (m+2)-th clock signal CK(m+2) is low so that the tenth TFT T10 is turned off; because the resistor R1 divides the voltage, the third node P(n) is charged to the constant high voltage VGH, the fourth and seventh TFTs T4, T7 are both conductive, the gate scan signal G(n) and the second node Q(n) are maintained at the constant low voltage VGL; when the (m+2)-th clock signal CK(m+2) is high, the tenth TFT T10 is conductive and the m-th clock signal CK(m) is low so that the ninth TFT T9 is turned off; because the resistor R1 divides the voltage, the third node P(n) is pulled down to the constant low voltage VGL, so as to discharge the third node P(n) to prevent the third node P(n) from staying at high level for extended time to cause threshold voltage shift in key TFT.

Figure 8:
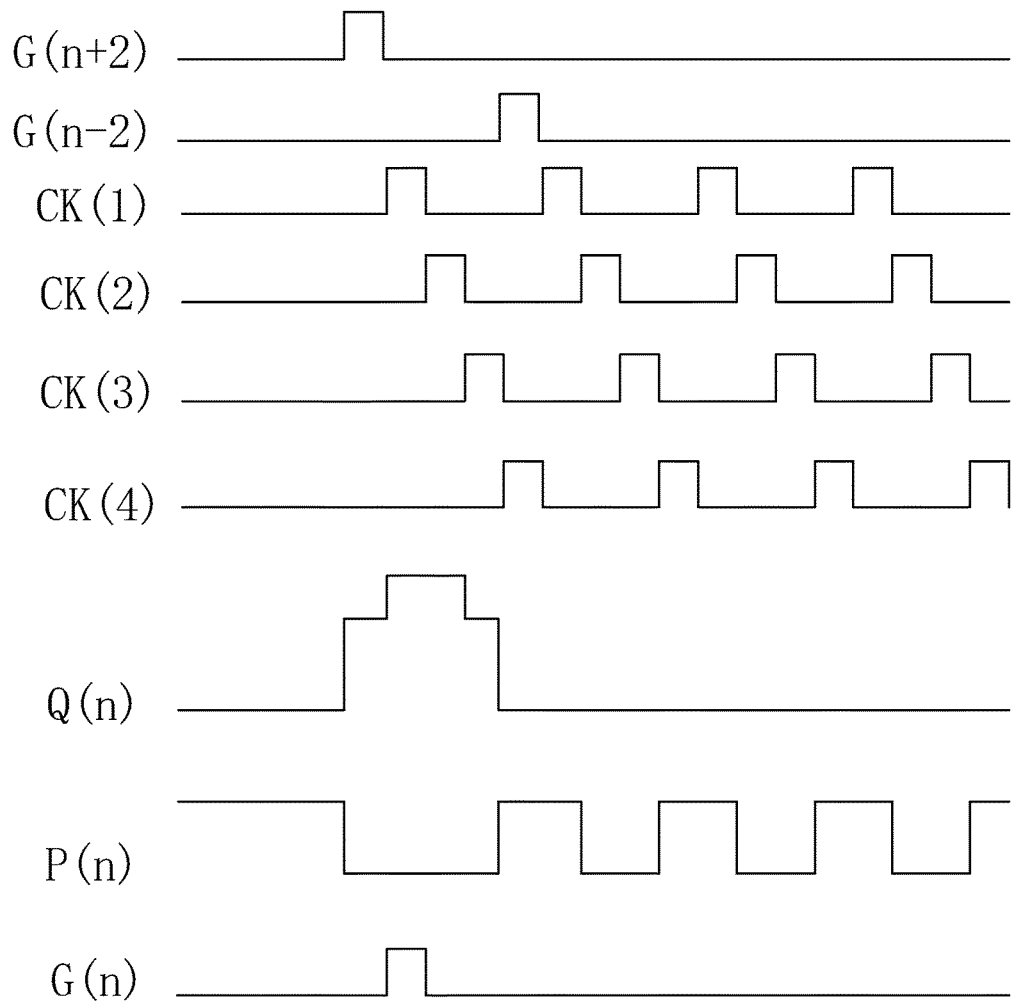
FIG. 8 is a schematic view showing the backward scanning timing for GOA circuit provided by an embodiment of the present invention.

Correspondingly, refer to FIG. 8. FIG. 8 shows the backward scanning timing of the GOA circuit of the present invention. The backward scanning operation scans in the direction opposite to the scanning direction of the forward scanning, the scanning order is from the last stage to the first last with the forward scan control signal U2D is low and the backward scan control signal D2U is high. The remaining of the operation is the same as the forward scanning, and will not be repeated here.

In summary, the present invention provides a GOA circuit, using the ninth and tenth TFTs and the resistor to control the voltage level of the third node, wherein ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor. Through the m-th and the (m+2)-th clock signal to control the ninth and tenth TFTs to become conductive alternately, the present invention can charge and discharge the third node regularly to prevent the threshold voltage shift of the key TFT because the third node stays high for extended time, and ensure the stability of GOA circuit.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A gate driver on array (GOA) circuit, which comprises: a plurality of cascade GOA units, each GOA unit comprising: a scan control module, an output module connected to the scan control module, a pull-down module connected to the output module, and a pull-down control module connected to the scan control module, the output module and the pull-down module;

for a positive integer n and a positive number m, other than the GOA unit in the first, the second, the second last and the last stages, in the n-th GOA unit:

the scan control module using a forward scan control signal and a backward scan control signal to control the GOA circuit to perform forward scanning or backward scanning;

the output module being connected to an (m+1)-th clock signal for using the (m+1)-th clock signal to output an n-th gate scan signal during an operation duration of the n-th GOA unit;

the pull-down module pulling down the voltage level of the n-th gate scan signal during a non-operation duration of the n-th GOA unit; and the pull-down control module being connected to an m-th clock signal, an (m+2)-th clock signal, a first constant voltage, and a second constant voltage, for shutting down the pull-down module and maintaining the output module turned on during the operation duration of the n-th GOA unit, and turning on the pull-down module and shutting down the output module during the non-operation duration of the n-th GOA unit, as well as using the m-th clock signal and the (m+2)-th clock signal to control the first constant voltage and the second constant voltage to regularly charge and discharge a switch node of the pull-down module;

the first constant voltage and the second constant voltage having opposite voltage levels, and the forward scan control signal and the backward scan control signal having opposite voltage levels.

2. The GOA circuit as claimed in claim 1, wherein the scan control module comprises: a first thin film transistor (TFT) and a third TFT; the output module comprises: a second TFT and a first capacitor; the pull-down module comprises: a fourth TFT, a eighth TFT, and a second capacitor; and the pull-down control module comprises: a sixth TFT, seventh TFT, a ninth TFT, a tenth TFT and a resistor; the GOA circuit further comprises a regulator module, which comprising: a fifth TFT;

the first TFT having the gate connected to the gate scan signal of the (n−2)-th GOA unit, the source connected to the forward scan control signal, and the drain connected to a first node; the second TFT having the gate connected to a second node, the source connected to the (m+1)-th clock signal, and the drain connected to the gate scan signal of the n-th GOA unit; the third TFT having the gate connected to the gate scan signal of the (n+2)-th GOA unit, the source connected to the backward scan control signal, and the drain connected to the first node; the fourth TFT having the gate connected to a third node, the source connected to the gate scan signal of the n-th GOA unit, and the drain connected to the second constant voltage; the fifth TFT having the gate connected to the first constant voltage, the source connected to the first node, and the drain connected to the second node; the sixth TFT having the gate connected to the first node, the source connected to the third node, and the drain connected to the second constant voltage; the seventh TFT having the gate connected to the third node, the source connected to the second node, and the drain connected to the second constant voltage; the eighth TFT having the gate connected to an (m+3)-th clock signal, the source connected to the gate scan signal of the n-th GOA unit, and the drain connected to the second constant voltage; the ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor; the second capacitor having one end connected to the third node and the other end connected to the second constant voltage; the first capacitor having one end connected to the second node and the other end connected to the gate scan signal of the n-th GOA unit; and the third node is the switch node of the pull-down module.

3. The GOA circuit as claimed in claim 2, wherein in the first-stage and the second-stage GOA units, the gates of the first TFTs are connected to a circuit activation signal; in the second-last-stage and the last-stage GOA units, the gates of the third TFTs are connected to a circuit activation signal.

4. The GOA circuit as claimed in claim 1, wherein the clock signals comprise four clock signals: a first clock signal, a second clock signal, a third clock signal and a fourth clock signal, when the m-th clock signal is the second clock signal, the (m+3)-th clock signal is the first clock signal; when the m-th clock signal is the third clock signal, the (m+2)-th clock signal is the first clock signal and the (m+3)-th clock signal is the second clock signal; when the m-th clock signal is the fourth clock signal, the (m+1)-th clock signal is the first clock signal, the (m+2)-th clock signal is the second clock signal and the (m+3)-th clock signal is the third clock signal.

5. The GOA circuit as claimed in claim 4, wherein the first, second, third and fourth clock signals have the same pulse cycle, and the falling edge of a previous clock signal is generated simultaneously with the rising edge of a next clock signal.

6. The GOA circuit as claimed in claim 2, wherein all the TFTs are of the N-type TFTs, the first constant voltage is a constant high voltage, and the second constant voltage is a constant low voltage.

7. The GOA circuit as claimed in claim 2, wherein all the TFTs are of the P-type TFTs, the first constant voltage is a constant low voltage, and the second constant voltage is a constant high voltage.

8. The GOA circuit as claimed in claim 2, wherein all the TFTs are of the low temperature polysilicon (LTPS) TFTs.

9. The GOA circuit as claimed in claim 6, wherein during forward scanning, the forward scan control signal is at high level, and the backward scan control signal is at low level;
during backward scanning, the forward scan control signal is at low level, and the backward scan control signal is at high level.

10. The GOA circuit as claimed in claim 7, wherein during forward scanning, the forward scan control signal is at low level, and the backward scan control signal is at high level;
during backward scanning, the forward scan control signal is at high level, and the backward scan control signal is at low level.

11. A gate driver on array (GOA) circuit, which comprises: a plurality of cascade GOA units, each GOA unit comprising: a scan control module, an output module connected to the scan control module, a pull-down module connected to the output module, and a pull-down control module connected to the scan control module, the output module and the pull-down module;
for a positive integer n and a positive number m, other than the GOA unit in the first, the second, the second last and the last stages, in the n-th GOA unit:
the scan control module using a forward scan control signal and a backward scan control signal to control the GOA circuit to perform forward scanning or backward scanning;
the output module being connected to an (m+1)-th clock signal for using the (m+1)-th clock signal to output an n-th gate scan signal during an operation duration of the n-th GOA unit;
the pull-down module pulling down the voltage level of the n-th gate scan signal during a non-operation duration of the n-th GOA unit; and
the pull-down control module being connected to an m-th clock signal, an (m+2)-th clock signal, a first constant voltage, and a second constant voltage, for shutting down the pull-down module and maintaining the output module turned on during the operation duration of the n-th GOA unit, and turning on the pull-down module and shutting down the output module during the non-operation duration of the n-th GOA unit, as well as using the m-th clock signal and the (m+2)-th clock signal to control the first constant voltage and the second constant voltage to regularly charge and discharge a switch node of the pull-down module;
the first constant voltage and the second constant voltage having opposite voltage levels, and the forward scan control signal and the backward scan control signal having opposite voltage levels;
the scan control module comprising: a first thin film transistor (TFT) and a third TFT; the output module comprising: a second TFT and a first capacitor; the pull-down module comprising: a fourth TFT, a eighth TFT, and a second capacitor; and the pull-down control module comprising: a sixth TFT, a seventh TFT, a ninth TFT, a tenth TFT and a resistor; the GOA circuit further comprising a regulator module, which comprising: a fifth TFT;
the first TFT having the gate connected to the gate scan signal of the (n−2)-th GOA unit, the source connected to the forward scan control signal, and the drain connected to a first node; the second TFT having the gate connected to a second node, the source connected to the (m+1)-th clock signal, and the drain connected to the gate scan signal of the n-th GOA unit; the third TFT having the gate connected to the gate scan signal of the (n+2)-th GOA unit, the source connected to the backward scan control signal, and the drain connected to the first node; the fourth TFT having the gate connected to a third node, the source connected to the gate scan signal of the n-th GOA unit, and the drain connected to the second constant voltage; the fifth TFT having the gate connected to the first constant voltage, the source connected to the first node, and the drain connected to the second node; the sixth TFT having the gate connected to the first node, the source connected to the third node, and the drain connected to the second constant voltage; the seventh TFT having the gate connected to the third node, the source connected to the second node, and the drain connected to the second constant voltage; the eighth TFT having the gate connected to an (m+3)-th clock signal, the source connected to the gate scan signal of the n-th GOA unit, and the drain connected to the second constant voltage; the ninth TFT having the gate connected to the m-th clock signal, the source connected to the first constant voltage, and the drain connected to one end of the resistor; the tenth TFT having the gate connected to the (m+2)-th clock signal, the source connected to the second constant voltage, and the drain connected to the other end of the resistor; the second capacitor having one end connected to the third node and the other end connected to the second constant voltage; the first capacitor having one end connected to the second node and the other end connected to the gate scan signal of the n-th GOA unit;
the third node being the switch node of the pull-down module;
wherein in the first-stage and the second-stage GOA units, the gates of the first TFTs being connected to a circuit activation signal;
in the second-last-stage and the last-stage GOA units, the gates of the third TFTs being connected to a circuit activation signal;
wherein all the TFTs being of the low temperature polysilicon (LTPS) TFTs.

12. The GOA circuit as claimed in claim 11, wherein the clock signals comprise four clock signals: a first clock signal, a second clock signal, a third clock signal and a fourth clock signal, when the m-th clock signal is the second clock signal, the (m+3)-th clock signal is the first clock signal; when the m-th clock signal is the third clock signal, the (m+2)-th clock signal is the first clock signal and the (m+3)-th clock signal is the second clock signal; when the m-th clock signal is the fourth clock signal, the (m+1)-th clock signal is the first clock signal, the (m+2)-th clock signal is the second clock signal and the (m+3)-th clock signal is the third clock signal.

13. The GOA circuit as claimed in claim 12, wherein the first, second, third and fourth clock signals have the same pulse cycle, and the falling edge of a previous clock signal is generated simultaneously with the rising edge of a next clock signal.

14. The GOA circuit as claimed in claim 11, wherein all the TFTs are of the N-type TFTs, the first constant voltage is a constant high voltage, and the second constant voltage is a constant low voltage.

15. The GOA circuit as claimed in claim 11, wherein all the TFTs are of the P-type TFTs, the first constant voltage is a constant low voltage, and the second constant voltage is a constant high voltage.

16. The GOA circuit as claimed in claim 14, wherein during forward scanning, the forward scan control signal is at high level, and the backward scan control signal is at low level;
 during backward scanning, the forward scan control signal is at low level, and the backward scan control signal is at high level.

17. The GOA circuit as claimed in claim 15, wherein during forward scanning, the forward scan control signal is at low level, and the backward scan control signal is at high level;
 during backward scanning, the forward scan control signal is at high level, and the backward scan control signal is at low level.

\* \* \* \* \*